United States Patent
Taga

(10) Patent No.: US 6,734,601 B2
(45) Date of Patent: May 11, 2004

(54) SURFACE ACOUSTIC WAVE DEVICE, METHOD FOR MAKING THE SAME, AND COMMUNICATION APPARATUS INCLUDING THE SAME

(75) Inventor: Shigeto Taga, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/090,151

(22) Filed: Mar. 5, 2002

(65) Prior Publication Data

US 2002/0145362 A1 Oct. 10, 2002

(30) Foreign Application Priority Data

Apr. 10, 2001 (JP) ........................................ 2001-111783

(51) Int. Cl.[7] .............................................. H01L 41/04
(52) U.S. Cl. ................................... 310/313 R; 310/363
(58) Field of Search ............................. 310/313 R, 344, 310/363

(56) References Cited

U.S. PATENT DOCUMENTS

| | | | | |
|---|---|---|---|---|
| 5,699,027 A | * | 12/1997 | Tsuji et al. .................. 333/193 |
| 5,821,665 A | * | 10/1998 | Onishi et al. ............ 310/313 R |
| 5,939,817 A | * | 8/1999 | Takado ........................ 310/348 |
| 5,969,461 A | * | 10/1999 | Anderson et al. ....... 310/313 R |
| 6,078,123 A | * | 6/2000 | Tanaka et al. .......... 310/313 R |
| 6,150,748 A | * | 11/2000 | Fukiharu ................ 310/313 R |
| 6,369,490 B1 | * | 4/2002 | Taga ........................... 310/364 |
| 2001/0033120 A1 | * | 10/2001 | Kobayashi et al. ..... 310/313 B |

FOREIGN PATENT DOCUMENTS

| | | | | |
|---|---|---|---|---|
| JP | 5-335878 | * | 12/1993 | ............. 310/313 R |
| JP | 2000-196407 | | 7/2000 | |
| JP | 2000-299355 | | 10/2000 | |

* cited by examiner

Primary Examiner—Thomas M. Dougherty
(74) Attorney, Agent, or Firm—Keating & Bennett, LLP

(57) ABSTRACT

A surface acoustic wave device includes a surface acoustic wave element and an electronic component package for supporting the surface acoustic wave element. The surface acoustic wave element includes a piezoelectric substrate that has interdigital electrodes and electrode pads thereon. The electrode pads input and output electrical signals to and from the respective interdigital electrodes. The electronic component package has electrode pattern sections for inputting and outputting electrical signals. The surface acoustic wave device further includes metal bump connections for electrically connecting between the electrode pads and the respective electrode pattern sections. The electrode pads include aluminum as the major component and copper as a minor component, the copper content being at least about 3.5 percent by weight. To connect the electrode pads to the respective electrode pattern sections, the metal bump connections are formed by a flip chip process using ultrasonic waves.

22 Claims, 7 Drawing Sheets

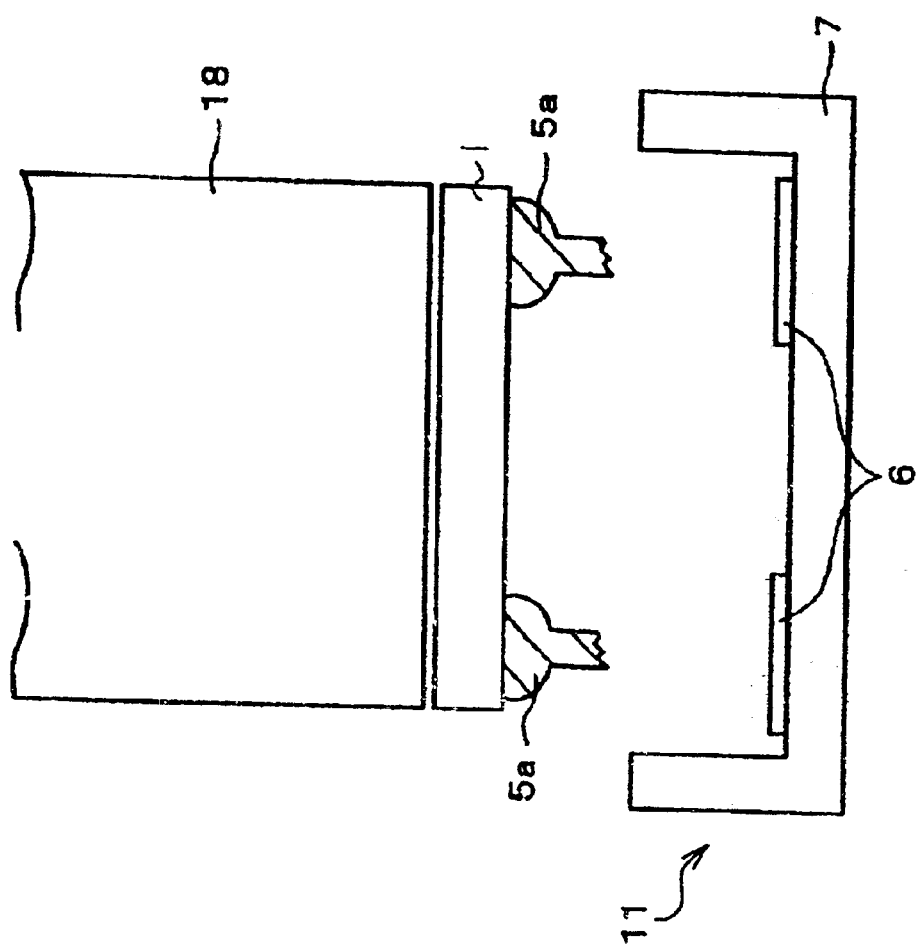

SURFACE ACOUSTIC WAVE DEVICE, METHOD FOR MAKING THE SAME, AND COMMUNICATION APPARATUS INCLUDING THE SAME

BACKGROUND OF THE INVENTION

1. Field of the Invention

The present invention relates to a surface acoustic wave device, a method for making such a surface acoustic wave device, and a communication apparatus including such a surface acoustic wave device. In particular, the present invention relates to a surface acoustic wave device prepared by a flip chip process, in which metal bumps are disposed on electrode pads provided on a piezoelectric substrate of a surface acoustic wave element, and the electrode pads are connected to electrode pattern sections disposed in the interior of an electronic component package made of ceramic or other suitable material via the metal bumps.

2. Description of the Related Art

With recent trends towards compactness and versatility of communication devices such as portable communication terminals, further reductions in size and particularly in height are required for electronic components mounted therein. One of the electronic components used in such communication devices is a surface acoustic wave device.

The surface acoustic wave device used includes a surface acoustic wave element and an electronic component package to accommodate the surface acoustic wave element. The surface acoustic wave element includes a piezoelectric substrate. Interdigital electrodes and electrode pads for inputting and outputting electrical signals to and from the interdigital electrodes are provided on the piezoelectric substrate. The electronic component package is defined by a box made of a ceramic material such as alumina.

Flip chip processes are used for mounting surface acoustic wave elements in electronic component packages to reduce the size and particularly height thereof. In the flip chip process, electrode pattern sections are provided on an inner surface of the electronic component package at positions corresponding to the electrode pads of the surface acoustic wave device.

The flip chip process includes the following steps:

(1) Metal bumps are formed on respective electrode pads of the surface acoustic wave element;
(2) The metal bumps are sandwiched between the electrode pads and respective electrode pattern sections on the mounting surface of the electronic component package such that the functional surface of the surface acoustic wave element faces the electronic component package;
(3) The surface acoustic wave element is pressed toward the electronic component package to apply a load to the metal bumps; and
(4) The metal bump connections of the metal bumps are connected to the respective electrode pattern sections and the respective electrode pads on the mounting surface of the electronic component package by the load.

Procedures often used to mount the surface acoustic wave element in the electronic component package by the flip chip process include simultaneous application of a load and ultrasonic waves and simultaneous application of a load, ultrasonic waves, and heat.

In the surface acoustic wave device made with the flip chip process, the connections between the metal bumps on the surface acoustic wave element and the respective electrode pattern sections on the electronic component package must have high electrical conductivity and high mechanical strength to fix the surface acoustic wave element on the electronic component package. In other words, the connections must be highly reliable.

In known flip chip processes, however, cracks often form on the piezoelectric substrate at locations the electrode pads. These cracks decrease the bonding strength between the surface acoustic wave element and the electronic component package. As a result, the surface acoustic wave device cannot withstand dropping shock, impact, and thermal stress.

The method for making a surface acoustic wave filter and the characteristics and reliability thereof with a flip chip process are reported in TECHNICAL REPORT OF IEICE. US95-26, EMD95-22, CPM95-34 (1995-07), p. 47, titled "Flip Chip GHz-Band SAW (Surface Acoustic Wave) Filter"; Hiromi YATSUTA, Masatoshi OGURI, and Taira HORISHIMA (Japan Radio Co., Ltd.).

In this paper, a load, heat, and ultrasonic waves are applied to connect metal bumps on a chip (piezoelectric substrate) of the surface acoustic wave with the respective electrode pattern sections of the electronic component package. Furthermore, the report describes that an excess load or excess ultrasonic wave power in the flip chip process causes cracking on the chip at locations of the electrode pads.

In general, it is believed that an increased load, increased ultrasonic power, or an increased temperature is effective in improving the bonding strength of the metal bump of the surface acoustic wave device. However, an excess load or excess ultrasonic wave power often causes surface cracking of the piezoelectric substrate, as described above.

Such surface cracking of the piezoelectric substrate decreases the bonding strength between the surface acoustic wave element and the electronic component package. Hence, the surface acoustic wave device cannot withstand dropping shock, impact, and thermal stress.

As a result, a communication apparatus using such a surface acoustic wave device is also unreliable.

SUMMARY OF THE INVENTION

In order to overcome the above-described problems, preferred embodiments of the present invention provide a highly reliable surface acoustic wave made by a flip chip process.

Another preferred embodiment of the present invention provides a method for making the surface acoustic wave by a flip chip process.

Another preferred embodiment of the present invention provides a communication apparatus including the surface acoustic wave device.

According to a first preferred embodiment of the present invention, a surface acoustic wave device includes a surface acoustic wave element including a piezoelectric substrate which has interdigital electrodes and electrode pads thereon, the electrode pads input and output electrical signals to and from the respective interdigital electrodes, an electronic component package to support the surface acoustic wave element, the electronic component package including electrode pattern sections for inputting and outputting electrical signals, and metal bump connections to electrically connect the electrode pads to the respective electrode pattern sections, wherein the electrode pads include aluminum as the major component and copper as a minor component, the copper content being at least about 3.5 percent by weight.

Herein, the interdigital electrodes are also referred to as interdigital transducers (IDTs).

Electrical signals input to the piezoelectric substrate through the IDTs are transformed into surface acoustic waves, which are retransformed into electrical signals by the IDTs. Thus, this surface acoustic wave device functions as a filter that transmits only electrical signals within a desired pass band.

Since the metal bump connections for electrically connecting the electrode pads to the electrode pattern sections are provided, the electrode pads and the electrode pattern sections are disposed within the surface area of the surface acoustic wave element, hence, the volume of the package is greatly reduced as compared with packaging by known wire bonding methods.

Since the surface acoustic wave element is supported in the electronic component package via the metal bump connections, the surface of the surface acoustic wave element having the IDTs mounted thereon is spaced from the electronic component package by forming the electrode pads on the same surface, resulting in stable operation of the IDTs.

As described above, the electrode pads include aluminum as the major component and copper as a minor component and the copper content is at least about 3.5 percent by weight. Such an electrode pad composition reduces cracking on the piezoelectric substrate at the locations of the electrode pads.

Furthermore, the above-mentioned configuration minimizes breakage of the surface acoustic wave element and prevents a decrease in bonding strength between the surface acoustic wave device and the electronic component package, resulting in greatly improved production yield, greatly reduced defect rate, and greatly improved product reliability.

Preferably, the metal bump connections include elemental gold or an alloy including gold as the primary component. Since gold and gold alloy have high ductility, the gold bump connections provide secure electrical and mechanical connections between the electrode pads and the respective electrode pattern sections. Thus, the surface acoustic wave element is more securely bonded to the electronic component package which prevents the surface acoustic wave element from breaking.

According to another preferred embodiment of the present invention, a method for making the above-described surface acoustic wave device includes the steps of sandwiching a metal bump between each electrode pad and the corresponding electrode pattern section on the electronic component package, and forming the corresponding metal bump connection from the metal bump by applying ultrasonic waves.

In this method, the surface acoustic wave element is securely bonded to the electronic component package in the surface acoustic wave device which prevents the surface acoustic wave element from breaking. Furthermore, the metal bump connections are formed with the metal bumps by applying ultrasonic waves. Since this ultrasonic process reduces thermal damage of other components such as the IDTs as compared with heating processes such as soldering, the resulting surface acoustic wave device is highly reliable.

In the above-described method, the metal bump is placed on the corresponding electrode pad before the metal bump is sandwiched between the electrode pad and the electrode pattern section. Since the electrode pad is exposed at the surface of the piezoelectric substrate, the metal bump is more easily placed on the corresponding electrode pad as compared with providing a metal bump on an electrode pattern section in an electronic component package. Thus, according to this additional step, the production process of the surface acoustic wave device is simplified with high reliability.

According to another preferred embodiment of the present invention, a communication apparatus includes the above-described surface acoustic wave device. As a result, the communication apparatus is also highly reliable.

Other features, elements, characteristics and advantages of the present invention will become more apparent from the following detailed description of preferred embodiments thereof with reference to the attached drawings.

BRIEF DESCRIPTION OF THE DRAWINGS

FIGS. 5A and 5B are schematic cross-sectional views illustrating the steps of bonding a surface acoustic wave element provided with the bumps to a package.

DETAILED DESCRIPTION OF PREFERRED EMBODIMENTS

The preferred embodiments of the present invention will be described with reference to FIGS. 1 to 8.

Figure 2:
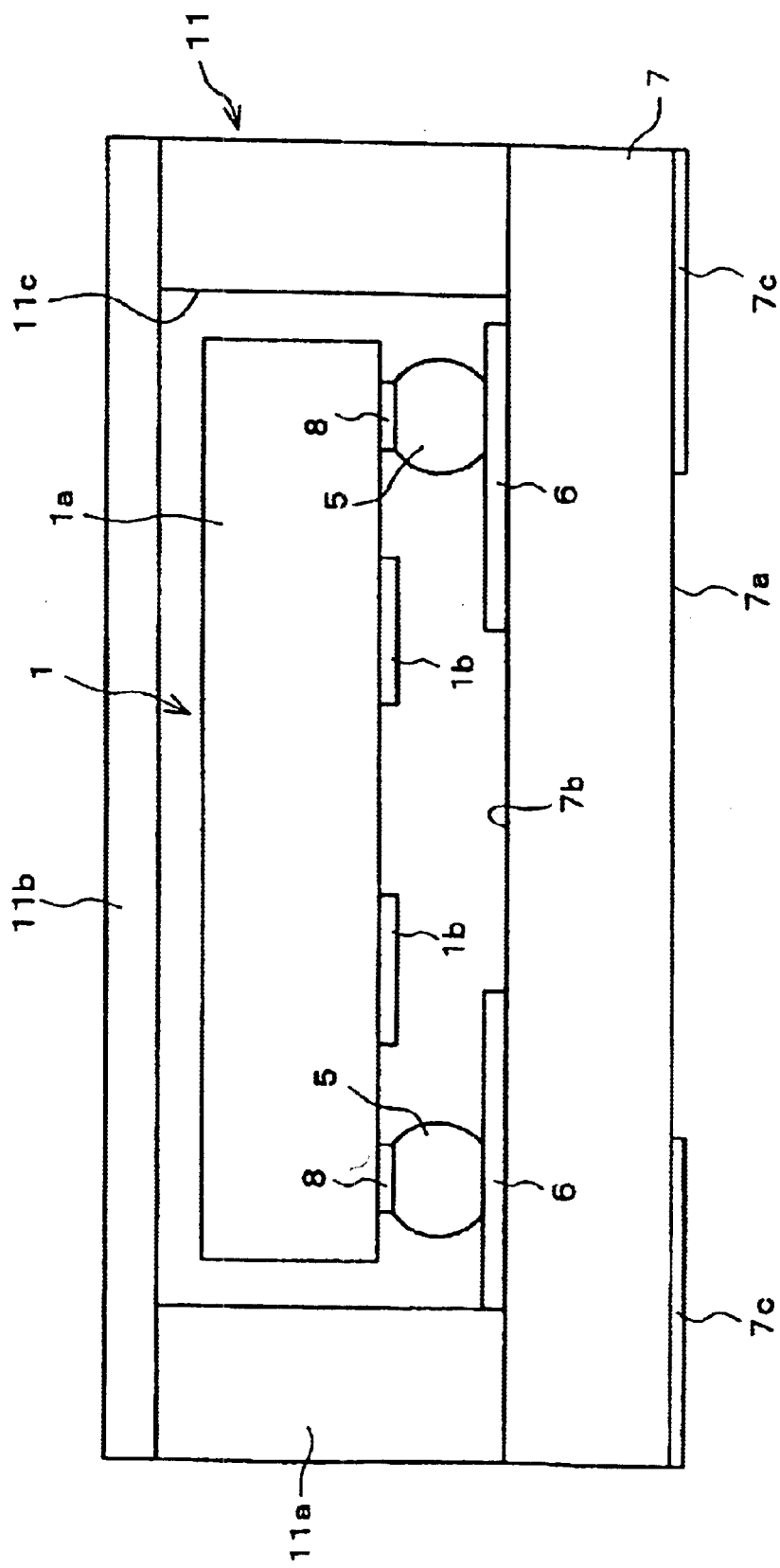
FIG. 2 is a schematic cross-sectional view of the surface acoustic wave device shown in FIG. 1.

Referring to FIG. 2, a surface acoustic wave device according to the first preferred embodiment includes a substantially rectangular package (electronic component package) 11 having a bottom and electronic components such as a surface acoustic wave element therein. The package 11 is preferably made of an electrical insulating material. Examples of electrical insulating materials are plastics, such as glass-epoxy resin, and ceramics, such as, alumina. Ceramics having higher thermal and corrosion resistance are preferred.

The package 11 may have any suitable dimensions. Preferably, the package 11 has the following maximum dimensions: a length of about 10 mm, a width of about 10 mm, and a height of about 5 mm. One example of the present preferred embodiment has the following dimensions: a length of about 2.5 mm, a width of about 2.0 mm, and a height of about 1.1 mm.

The package 11 has a bottom plate or base substrate 7, a sidewall component 11a, a cover 11b, and a cavity 11c. The cavity 11c accommodates a surface acoustic wave element 1 therein and is surrounded by the bottom plate 7, the sidewall component 11a, and the cover 11b.

The bottom plate 7 has a lower or outer surface 7a and an upper or inner surface 7b. The inner surface 7b is provided with electrode pattern sections 6 thereon to electrically connect the surface acoustic wave element 1 to the exterior of the package 11 for inputting and outputting electrical signals.

A plurality of external connection terminals, for example, six terminals 7c are provided on an outer surface, preferably, at four corners and in two central positions between the two corners in the vertical direction of the drawing, on the outer surface 7a such that the surface acoustic wave element 1 is connected to an external circuit. Preferably, the terminals 7c are made of a conductive metal such as silver. The terminals 7c are electrically connected to the respective electrode pattern sections 6 via sidewalls of the bottom plate 7 or through via holes provided in the bottom plate 7.

This surface acoustic wave element 1 transforms radiofrequency electrical signals of about 100 MHz or higher, and preferably in the GHz range or higher, by using surface acoustic waves. For example, the surface acoustic wave element 1 passes through signals within the pass band but blocks signals outside of the pass band. Furthermore, the surface acoustic wave element 1 performs impedance transformation and mutual transformation between unbalanced signals and balanced signals.

The surface acoustic wave element 1 includes a piezoelectric substrate 1a, interdigital transducers (IDTs) 1b, and electrodes 8 provided for the input/output terminals of the respective IDTs 1b. The electrodes 8 input and output electrical signals to and from the respective IDTs 1b. The IDTs 1b and the electrodes 8 are preferably made of a conductive foil (metal conductor) and are formed by a photolithographic process or other suitable process.

Each IDT 1b has two electrode finger portions each having a strip bus bar and a plurality of electrode fingers that extend substantially perpendicularly from one side of the bus bar and are substantially parallel to each other. The electrode fingers of one of the IDTs 1b and the electrode fingers of the other IDT 1b are interdigited with each other such that a side of an electrode finger of one IDT 1b faces a side of the adjacent finger of the other IDT 1b.

In such an arrangement of IDTs 1b, the length and width of each electrode finger, the distance between the two adjacent electrode fingers, and the interdigited length of the interdigited electrode fingers determine the signal transformation characteristics and the pass band of the surface acoustic wave element 1. Here, the interdigited length means a length of a portion of an electrode finger that faces the adjacent electrode finger.

The surface acoustic wave element 1 preferably has substantially the same shape as that of the piezoelectric substrate 1a, and thus has a substantially rectangular shape. The surface acoustic wave element 1 is disposed in the hermetically sealed cavity 11c such that the longitudinal directions of the surface acoustic wave element 1 and the cavity 11c are the same.

The surface acoustic wave element 1 is preferably mounted face-down in the cavity 11c of the package 11 by a flip chip process. Thus, each device electrode 8 of the surface acoustic wave element 1 and the corresponding electrode pattern section 6 of the package 11 are electrically connected to each other via a corresponding metal bump connection 5. Furthermore, the surface acoustic wave element 1 is mechanically supported in the package 1 by the bonding force of the metal bump connections 5.

In the surface acoustic wave element 1 mounted face-down on the bottom plate 7, a gap is provided between the IDTs 1b and the bottom plate 7 to enable these IDTs 1b to operate stably.

Such face-down mounting by the flip chip process facilitates electrical and mechanical connection between the surface acoustic wave element 1 and the package 11 and reduction in size of the resulting surface acoustic wave device.

Since the IDTs 1b face the bottom plate 7, the I/O wiring pattern between the IDTs 1b and the respective device electrodes 8 are simplified and the electrical connection and the mechanical connection is simultaneously achieved at the metal bump connections 5 by the flip chip process.

In such a flip chip process, the electrode pattern sections 6 are provided within the surface area of the surface acoustic wave element 1, and thus, the entire volume of the package 11 is reduced as compared with packaging by known wire bonding methods in which electrical connections must be provided at outer regions relative to the surface acoustic wave element.

Figure 1:
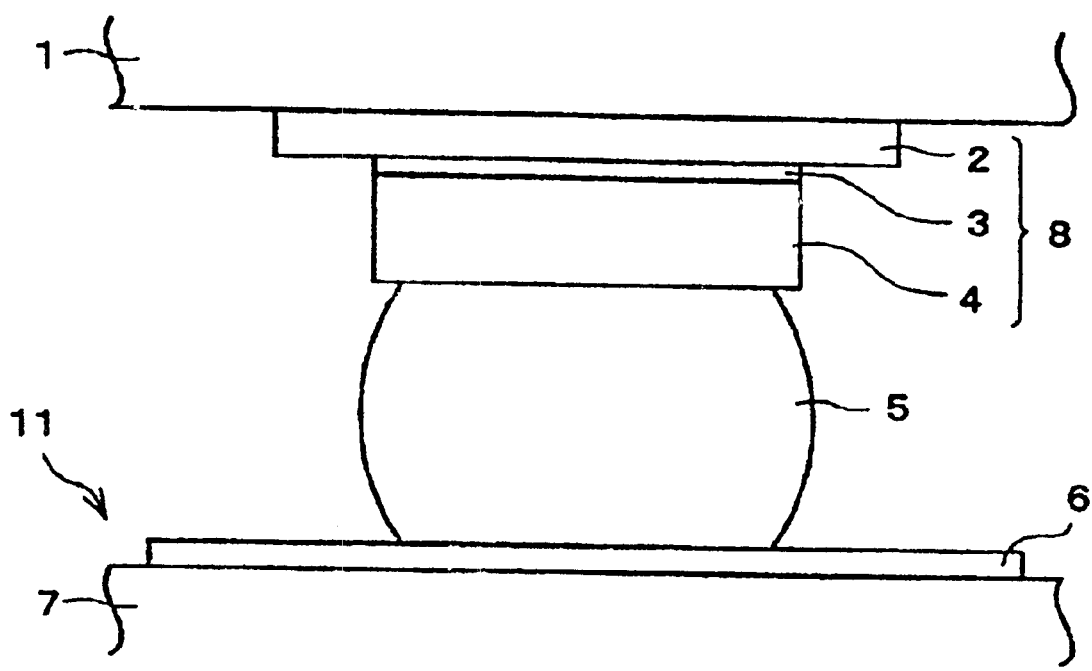
FIG. 1 is an enlarged partial cross-sectional view of a surface acoustic wave device according to a preferred embodiment of the present invention.

The metal bump connections 5 for the flip chip process will now be described with reference to FIG. 1.

Each device electrode 8 of the surface acoustic wave element 1 is defined by an electrode pad 2, an intermediate electrode 3, and an upper electrode 4, in that order from the surface acoustic wave element side. The electrode pads 2 and the IDTs 1b are provided on the same surface, i.e., the bottom surface of the piezoelectric substrate 1a as shown in FIG. 2. The electrode pads 2 preferably have a thickness in the range of about 100 nm to about 400 nm.

The electrode pads 2 are preferably made of an alloy of at least about 50% by weight of aluminum as the major component and at least about 3.5% by weight of copper as a minor component. The intermediate electrodes 3 on the electrode pads 2 are preferably made of NiCr. The upper electrodes 4 on the intermediate electrodes 3 are made of elemental aluminum or an aluminum alloy.

The electrode pads 2, the intermediate electrodes 3, and the upper electrodes 4 each may have any suitable area in the present invention. The area of each intermediate electrode 3 may be smaller than the area of the corresponding electrode pad 2. Each upper electrode 4 preferably has substantially the same shape as that of the corresponding intermediate electrode 3 such that the upper electrode 4 is stacked on the intermediate electrode 3 without displacement.

The surface of each electrode pattern section 6 on the bottom plate 7 is plated with gold. The upper electrodes 4 of the surface acoustic wave element 1 and the respective electrode pattern sections 6 of the package 11 are electrically and mechanically connected to each other via the respective metal bump connections 5. The metal bump connections 5 are preferably made of elemental gold or a gold alloy, which is a good conductor.

To connect the surface acoustic wave element 1 to the package 11 via the metal bump connections 5, it is preferable that metal bumps are initially provided on the device electrodes 8 as described below.

A method for making the surface acoustic wave element 1 will now be described with reference to FIGS. 3A, 3B, 4A and 4B.

Figure 3B:
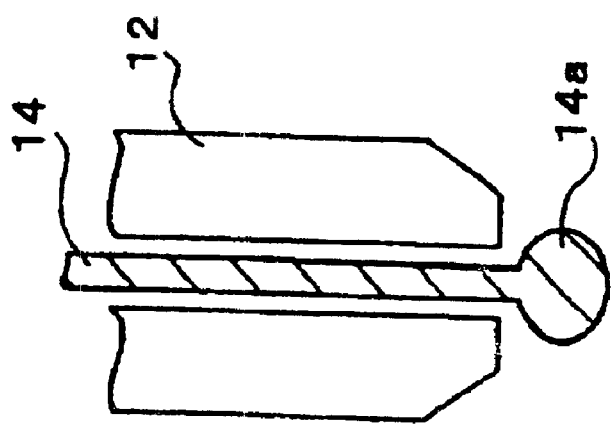
FIGS. 3A and 3B and 4A and 4B are schematic cross-sectional views illustrating the steps of forming metal bumps onto a wafer.
Figure 3A:
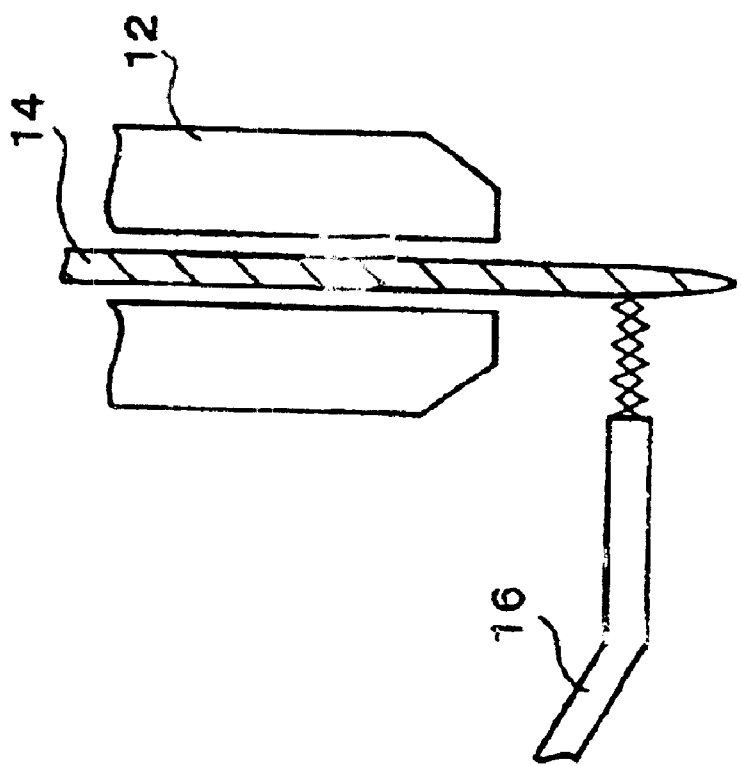
Figure 4A:
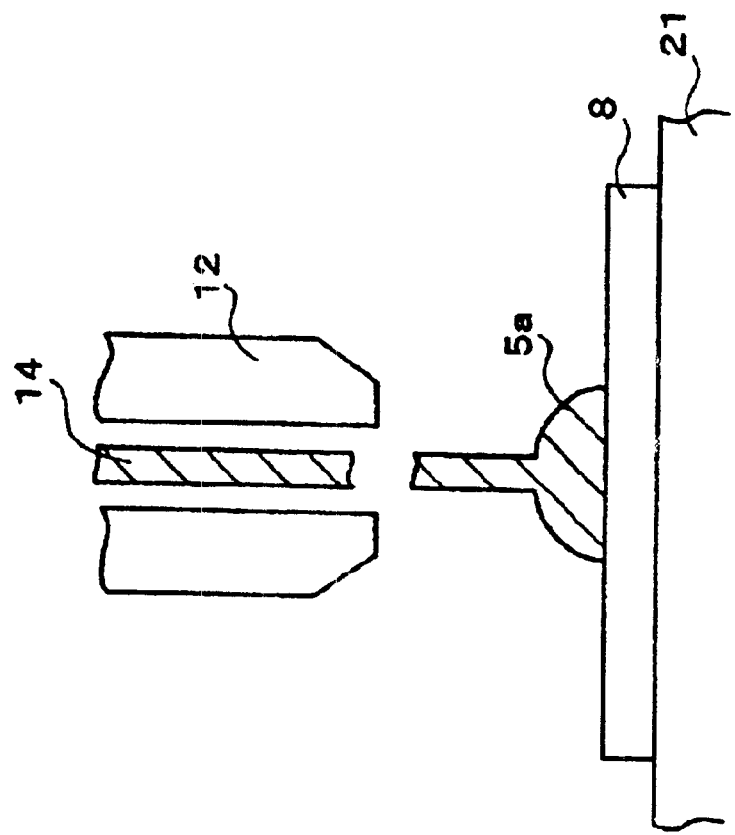

Referring to FIG. 4A, IDTs (not show in the drawing) and electrodes 8 are arranged on a piezoelectric wafer 21 according to an array pattern of the IDTs and the electrodes 8. The array pattern corresponds to a plurality of surface acoustic wave devices. Referring to FIG. 3A, a gold wire 14 extends by a desired length from the tip of a capillary 12 and high voltage is supplied to a torch 16 to generate an electric spark between the torch 16 and the gold wire 14. The tip of the gold wire 14 is thereby melted into a gold ball 14a as shown in FIG. 3B.

Referring to FIG. 4A, the melted gold ball 14a is substantially perpendicularly pressed onto the device electrode 8 and ultrasonic vibrations are substantially perpendicularly applied to the gold wire 14. The gold ball 14a is thereby fixed to the device electrode 8.

Figure 4B:
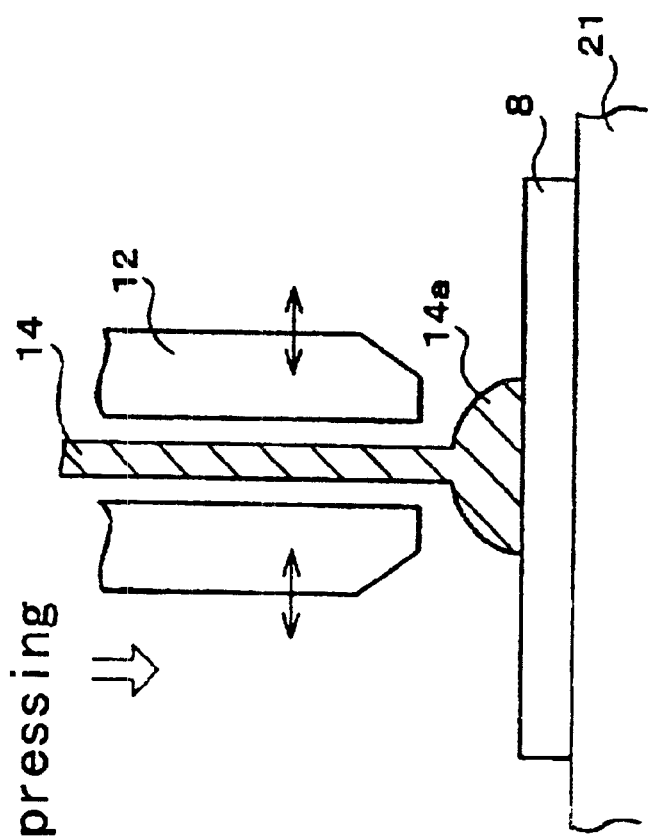

Referring to FIG. 4B, the gold wire 14 is cut in the vicinity of the gold ball 14a. A plurality of gold bumps 5a is formed on the device electrode 8 in this a manner.

The piezoelectric wafer 21 having the gold bumps 5a provided thereon is divided into surface acoustic wave elements 1 by dicing. Each surface acoustic wave element 1 includes gold bumps 5a on the corresponding device electrodes 8.

Such a gold bump 5a includes a semispherical main portion and a substantially perpendicular projection with respect to the device electrode 8.

FIGS. 5A and 5B illustrate a method for mounting the surface acoustic wave element 1 in the package 11 by a flip chip process.

Referring to FIG. 5B, the rear surface of the surface acoustic wave element 1 (the original figure is shown in FIG. 5A) is fixed to an ultrasonic unit 18 by vacuum chucking, and then the inverted surface acoustic wave element 1 is transferred onto the package 11. In this state, the cover 11b of the package 11 is not yet provided and the inner surface of the bottom plate 7 is horizontally arranged.

After the surface acoustic wave element 1 is placed onto the package 11 such that the gold bumps 5a are aligned with the respective electrode pattern sections 6, the element is pressurized with the ultrasonic unit 18.

Figure 6:
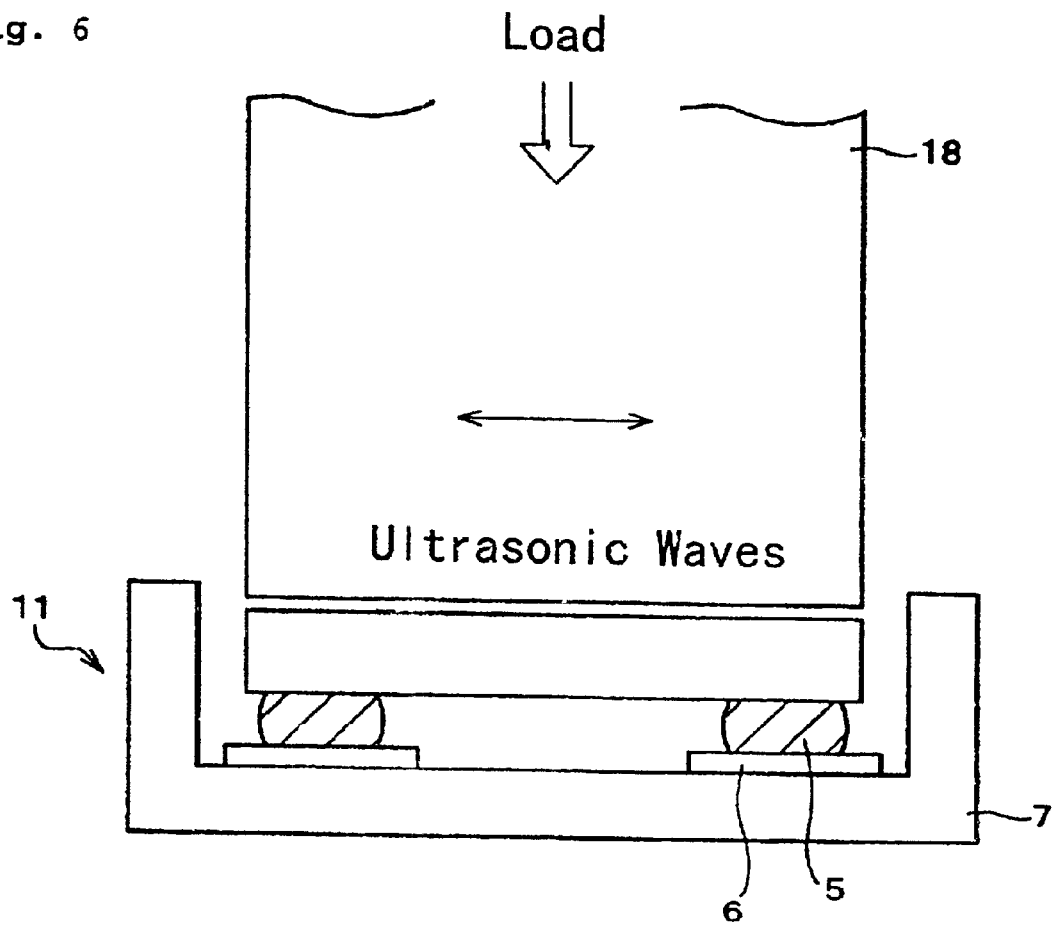
FIG. 6 is a schematic cross-sectional view illustrating the step of connecting the surface acoustic wave element to the package.

Referring to FIG. 6, ultrasonic vibrations (reciprocal vibrations) are applied along the surface of the gold bumps 5a. An additional substantially perpendicular load may be applied, if necessary. Heat that is lower than the soldering temperature may also be applied, if necessary.

The gold bumps 5a are thereby deformed, while intermetallic diffusion occurs between the gold bumps 5a and the gold-plated electrode pattern sections 6 by ultrasonic vibrations. Thus, the metal bumps 5a are bonded to the respective electrode pattern sections 6 to form metal bump connections 5. Interdiffusion also occurs between the metal bump connections 5 and the device electrodes 8 in this process, and thus, the bonding strength therebetween is greatly improved.

As shown in FIG. 2, the cover 11b is attached to the package 11 to complete the surface acoustic wave device. The surface acoustic wave element 1 is thereby mounted in the package 11 by ultrasonic waves.

In such a flip chip process, the surface acoustic wave element 1 is electrically and mechanically connected to the package 11 without thermal energy such as soldering. Since other components such as the IDTs 1b of the surface acoustic wave element 1 do not deteriorate in response to the application of such heat, the surface acoustic wave element 1 is highly reliable.

Figure 7:
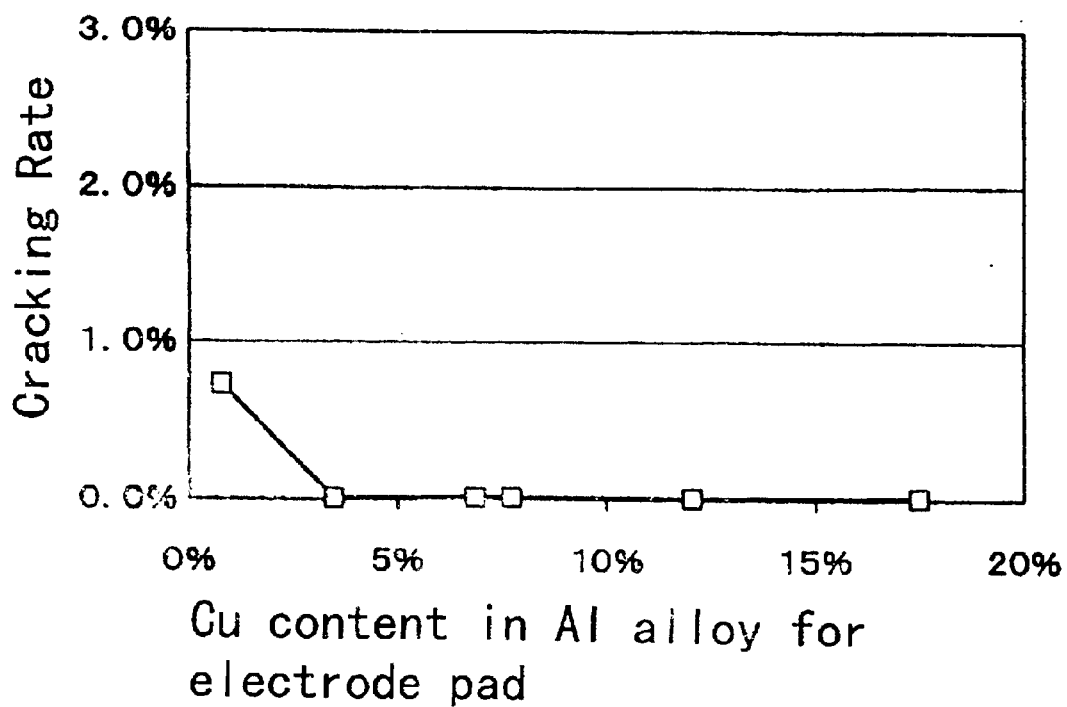
FIG. 7 is a graph illustrating the relationships between the copper content in the electrode pad and the cracking rate.

The results of experiments on materials for the electrode pad 2 of the surface acoustic wave element 1 will be described. FIG. 7 illustrates the relationship between the copper content (volume percent) in the electrode pad 2 and the cracking rate (proportion of generation of cracks). According to this graph, cracking is prevented at a copper content of about 3.5 percent by weight or more.

With an increased copper content, the resistance of the Al/Cu alloy defining the electrode pads 2 also increases. Thus, the copper content is preferably about 25 percent or less, and more preferably about 18 percent or less.

The above results will now be discussed. In the flip chip process, a large stress is applied to the electrode pads 2 of the surface acoustic wave element 1 by a load and ultrasonic power applied to connect the surface acoustic wave element 1 to the electrode pattern sections 6. Since the electrode pads 2 are provided in the peripheral regions of the piezoelectric substrate 1a, a large stress is applied to the peripheral surface regions of the piezoelectric substrate 1a.

On the other hand, the hardness of the Al/Cu alloy increases with the copper content. Thus, at a copper content of about 3.5 percent by weight or more, the hardness of the electrode pads 2 increases to a suitable level.

As a result, the electrode pad 2 protects the piezoelectric substrate 1a from stress generated during manufacturing of the device by the flip chip process and generated by shock in use. Thus, the piezoelectric substrate 1a does not crack, resulting in greatly increased production yield and greatly improved reliability in continuous use.

In the first preferred embodiment, the piezoelectric substrate 1a is preferably made of lithium tantalate. Other piezoelectric materials may also be used in the present invention. The internal electrodes 3 in the first preferred embodiment are provided to enhance the bonding strength between the electrode pads 2 and the respective upper electrodes 4, but may be omitted if the bonding strength therebetween is sufficiently high.

The intermediate electrodes 3 are composed of NiCr in the first preferred embodiment. Any metallic material exhibiting high bonding strength to the electrode pad 2 and the upper electrode 4 may be used in the present invention. The upper electrodes 4 may be made of any material having high bonding strength to the metal bumps 5a and the metal bump connections 5, for example, a gold alloy.

In the first preferred embodiment, the intermediate electrode 3 and the upper electrode 4 each have a single layer configuration. These electrodes may have a multilayer configuration as long as high bonding strength is achieved between the electrode pad 2 and the metal bump connection 5. Alternatively, a combination of the intermediate electrode 3 and the upper electrode 4 may be duplicated in the layering direction.

Figure 8:
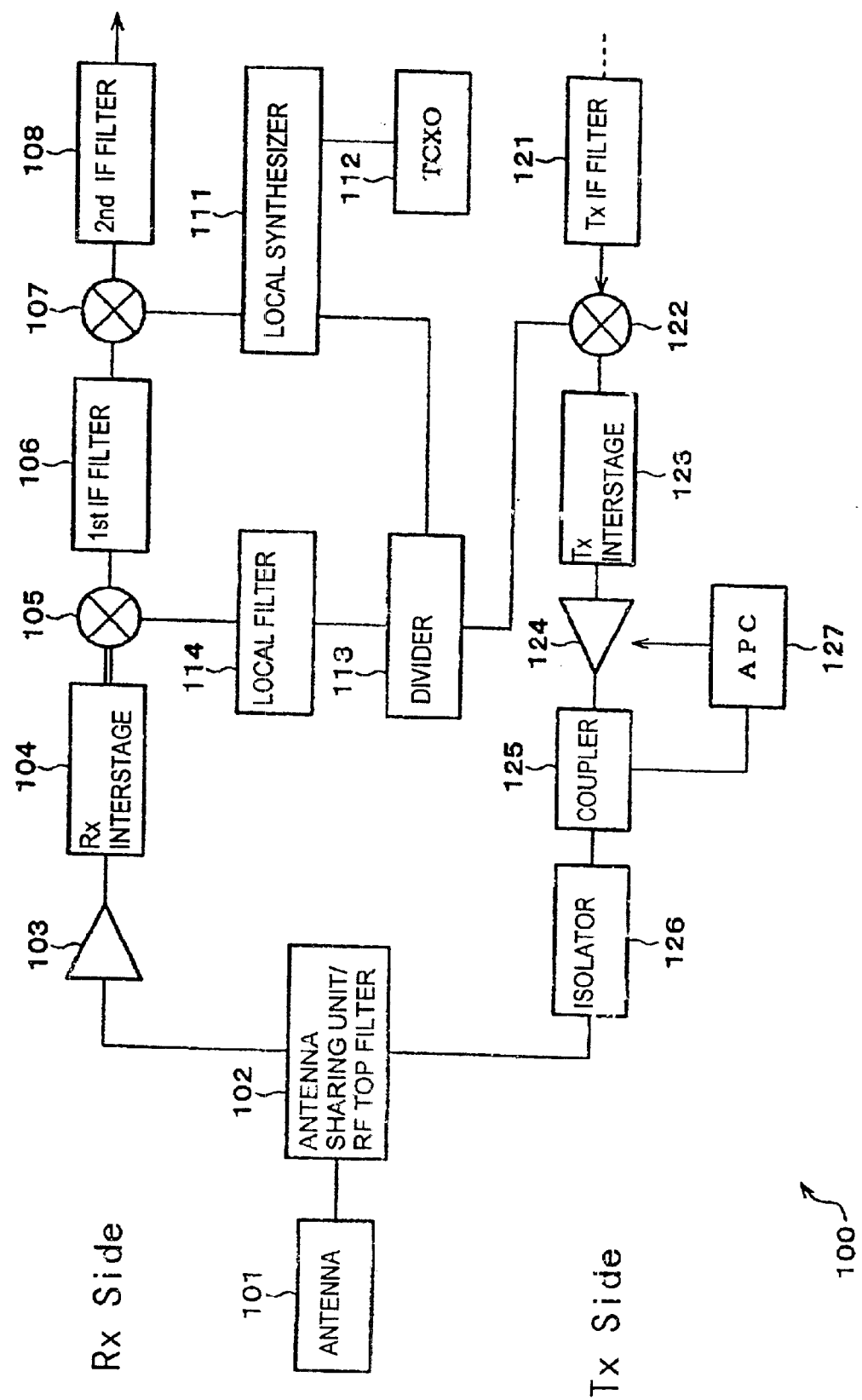
FIG. 8 is a block diagram of a communication apparatus including the surface acoustic wave device of various preferred embodiments of the present invention.

Referring to FIG. 8, according to a second preferred embodiment of the present invention, a communication apparatus 100 including the surface acoustic wave device according to the first preferred embodiment will be described. The communication apparatus 100 has an antenna 101, an antenna sharing unit/RF top filter 102, an amplifier 103, a receiver (Rx) interstage filter 104, a mixer 105, a first intermediate frequency (IF) filter 106, a mixer 107, a second IF filter 108, a local synthesizer 111, a temperature-compensated crystal oscillator (TCXO) 112, a divider 113, and a local filter 114, at the receiver (Rx) side. As shown by a doublet in FIG. 8, balanced signals are preferably transmitted from the Rx interstage filter 104 to the mixer 105 to ensure the balance.

The communication apparatus 100 shares the antenna 101 and the antenna sharing unit/RF top filter 102 at the transceiver (Tx) side. Furthermore, the communication apparatus 100, at the Tx side, has a Tx IF filter 121, a mixer 122, a Tx interstage filter 123, an amplifier 124, a coupler 125, an isolator 126, and an automatic power control (APC) 127.

The surface acoustic wave device according to the first preferred embodiment is preferably used for the Rx interstage filter 104, the first IF filter 106, the Tx IF filter 121, and the Tx interstage filter 123.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:
a surface acoustic wave element including a piezoelectric substrate having interdigital electrodes and electrode pads thereon, the electrode pads being arranged to input and output electrical signals to and from the respective interdigital electrodes;
an electronic component package supporting the surface acoustic wave element, the electronic component package including electrode pattern sections arranged to input and output electrical signals;
metal bump connections electrically connecting the electrode pads to the respective electrode pattern sections; and
intermediate electrodes and upper electrodes on the respective electrode pads; wherein
the electrode pads include aluminum as a major component and copper as a minor component, the cooper content being at least about 3.5 percent by weight; and
the intermediate electrodes are disposed between the respective electrode pads and the respective upper electrodes and include a material for enhancing the bonding strength therebetween, and the upper electrodes include a material for enhancing the bonding strength between the respective intermediate electrodes and the respective metal bump connections.

2. The surface acoustic wave device according to claim 1, wherein the metal bump connections comprise one of elemental gold and an alloy including gold as the primary component.

3. The surface acoustic wave device according to claim 1, wherein the metal bump connections include a metal bump disposed between each of the electrode pads and the corresponding electrode pattern section on the electronic component package.

4. The method for making the surface acoustic wave device according to claim 3, wherein the metal bump includes a semispherical main portion and a substantially perpendicular projection.

5. A communication apparatus comprising the surface acoustic wave device according to claim 1.

6. The surface acoustic wave device according to claim 1, wherein the copper content is in the range of about 3.5 to about 25 percent by weight.

7. The surface acoustic wave device according to claim 1, wherein the electrode pads include aluminum and copper, the copper content being in the range of about 3.5 to about 25 percent by weight.

8. The surface acoustic wave device according to claim 1, wherein the copper content is in the range of about 3.5 to about 18 percent by weight.

9. The surface acoustic wave device according to claim 1, wherein the electrode pattern sections are plated with gold.

10. The surface acoustic wave device according to claim 1, wherein the electronic component package includes a bottom plate, a sidewall component, a cover and a cavity, the cavity accommodates the surface acoustic wave element therein and is surrounded by the bottom plate, the sidewall component and the cover.

11. The surface acoustic wave device according to claim 10, wherein the electrode pattern sections are provided on an inner surface of the bottom plate.

12. The surface acoustic wave device according to claim 10, wherein a plurality of external connection terminals is provided on an outer surface of the bottom plate of the electronic component package, and each of the plurality of external connection terminals are electrically connected to respective electrode pattern sections.

13. The surface acoustic wave device according to claim 10, wherein the surface acoustic wave element is mounted face down in the electronic component package such that the interdigital electrodes face the bottom plate of electronic component package.

14. The surface acoustic wave device according to claim 10, wherein the surface acoustic wave element is spaced from the bottom plate of the electronic component by a gap.

15. The surface acoustic wave device according to claim 1, wherein the intermediate electrodes are made of NiCr.

16. The surface acoustic wave device according to claim 1, wherein the upper electrodes are made of one of elemental aluminum and an aluminum alloy.

17. The surface acoustic wave device according to claim 15, wherein the copper content is in the range of about 3.5 to about 25 percent by weight.

18. The surface acoustic wave device according to claim 15, wherein the electrode pads include aluminum and copper, the copper content being in the range of about 3.5 to about 25 percent by weight.

19. The surface acoustic wave device according to claim 15, wherein the copper content is in the range of about 3.5 to about 18 percent by weight.

20. The surface acoustic wave device according to claim 16, wherein the copper content is in the range of about 3.5 to about 25 percent by weight.

21. The surface acoustic wave device according to claim 16, wherein the electrode pads include aluminum and copper, the copper content being in the range of about 3.5 to about 25 percent by weight.

22. The surface acoustic wave device according to claim 16, wherein the copper content is in the range of about 3.5 to about 18 percent by weight.

* * * * *